United States Patent [19]
Lawson et al.

[11] Patent Number: 5,889,332
[45] Date of Patent: Mar. 30, 1999

[54] AREA MATCHED PACKAGE

[75] Inventors: Robert M. Lawson, Santa Clara; Jian Miremadi, Sunnyvale, both of Calif.

[73] Assignee: Hewlett-Packard Company, Palo Alto, Calif.

[21] Appl. No.: 802,965

[22] Filed: Feb. 21, 1997

[51] Int. Cl.$^6$ .................. H01L 23/48; H01L 23/495; H01L 23/28

[52] U.S. Cl. .................. 257/778; 257/668; 257/738; 257/787

[58] Field of Search .................. 257/668, 738, 257/778, 787

[56] References Cited

U.S. PATENT DOCUMENTS

| 5,461,197 | 10/1995 | Hiruta et al | 174/52.4 |
| 5,621,225 | 4/1997 | Shieh et al. | 257/81 |
| 5,704,116 | 1/1998 | Gamota et al. | 29/840 |

FOREIGN PATENT DOCUMENTS

| 0 567 932 A2 | 6/1995 | European Pat. Off. | H01L 23/49 |
| 08335653 | 12/1996 | Japan | H01L 23/29 |

OTHER PUBLICATIONS

Tanagawa et al., "The Resin Molded Chip Size Package (MCSP", 2 Oct. 1995, 17th. IEEE/CPMT International Electronics Manufacturing Technology Symposium, Austin, Oct. 2–4, 1995, pp. 410–415.

Matsuda et al., "Simple–Structure, Generally Applicable Chip–Scale Package", 21 May 1995, Proceedings of the Electronic Components and Technology Conference, Las Vegas, May 21–24, 1995, pp. 218–223.

Lall et al, "Reliability Characterization of the SLICC Package", 28 May 1996, 1996 Proceedings of the 46th. Electronic Components and Technology Conference, Orlando, May 28–31, 1996, pp. 1202–1210.

BPA (Technology & Management) Ltd., "Known Good Die and Chip Scale Packaging," BPA, Report No. 588, Sep. 1995, Surrey, UK.

Primary Examiner—Teresa M. Arroyo

[57] ABSTRACT

A chip-scale packaged integrated circuit and fabrication method are disclosed in which a semiconductor die and a rigid carrier of substantially identical geometric shape and size are aligned to form a packaged IC in which the die and carrier have a substantially 1:1 area ratio. A narrow gap between the die and carrier is bridged by the contact interconnections. An underfill material filling the gap and bonded to the die and carrier faces to relieve thermal expansion mismatch stresses. A fillet on one or more sides of the package is generally T-shaped in cross-section and nearly flat to the aligned side faces of the die and carrier. A fixture to facilitate fabrication of the package has a cavity with beveled sidewalls and seal which hold the die and carrier and form a narrow trough along the gap to receive and hold the underfill material adjacent the gap. The seal and cavity sidewalls have a surface to which the underfill material is nonadherent.

10 Claims, 2 Drawing Sheets

Prior Art    Present Invention

AREA MATCHED PACKAGE

BACKGROUND OF THE INVENTION

This invention relates to integrated circuit packages and more particularly to chip scale packages.

Chip scale packages (CSP) represent a new miniature type of semiconductor packaging used to address the issue of I/O densification and size in electronic products, especially for consumer type products such as telephones, pagers, video cameras, etc. With the trend moving to packing more and more features into decreasing product envelopes, utilizing ever smaller electronic components to improve upon size and feature densification is a constant formidable challenge for manufacturers of consumer and related articles.

Typically, in the electronic component world, integrated circuits (IC) are fabricated on a semiconductor substrate, known as a chip or die and most commonly made of silicon. This silicon IC chip or die is then typically mounted into a larger container (package) which serves 1) to provide effective enlargement of the distance (pitch) between the I/O contacts of the silicon suitable for attachment to printed circuit boards (PCB) in real world applications and 2) as a hermetic container to protect the IC from handling abuse.

Although recently the semiconductor industry has introduced reduced package sizes, such as those in area array format vs. most typical peripheral attach of the input and output (I/O) terminals such as in lead frame construction, the area on the PCB occupied by the package is much larger than the area occupied in the package by the silicon.

Many companies today are trying to solve the problems of utilizing the IC chip or die directly to the PCB, i.e., flip chip, without the use of an intermediate package. After all, the silicon chip represents the smallest size possible for the IC package. Although some manufacturers are using this technology with varying degrees of success in a few products today, numerous technical challenges not yet overcome effectively block the widespread use of flip chip.

Chip scale packages were invented to provide an alternative solution to flip chip. They are not hindered by most of the problems facing flip chip. Although not yet defined as a semiconductor industry standard, a chip scale package is currently loosely defined as a package that is within 20% larger than the IC itself, thus approaching the smallest size possible for a package (the IC chip).

Trade publications such as "Known Good Die and Chip Scale Packaging" published in the U.K. by BPA (1995 and 1996), have identified approximately 20 companies that are currently preparing to manufacture their own configuration of CSPs. Over 25 different configurations are represented.

The 25 or so different CSP types can be placed into several distinct categories. One category of interest for the applicants is the Rigid substrate type. Rigid substrates are typically characterized by the attachment of the silicon IC die to a rigid carrier or substrate (e.g., ceramic (organic types), and FR4, BT (inorganic, laminate types)) using a high temperature solder attach process which is well known in the industry. The carrier contains the appropriate electrical traces which route the I/O points on the IC to the opposite side of the rigid carrier (from the IC attachment side). The traces are run to appropriate I/O points (typically solder balls) on this opposite, or backside, of the carrier. The opposite side solder balls are then used in the solder attachment of the IC/carrier package to a matching electrical site (e.g., to a ball pattern) on the product PCB. This solder attach method is also well known in the industry.

Because the material of the IC and the carrier are different and expand at different rates when heated (when power is applied to the IC), severe stress is introduced to the solder connections between the silicon and the carrier. The stress caused by the thermal expansion coefficient mismatch as power to the IC is cycled on and off typically causes mechanical failure at one or more of the solder joints, in turn causing electrical failure of the product. To alleviate this problem and distribute the stresses, a polymeric filler or underencapsulant is introduced in liquid form by capillary action into the typical 2-mil to 4-mil gap or standoff between the circuit side of the chip and the contact side of the substrate. The "underfill" completely fills the volume under the IC around all the solder joints. It cures to a rigid form via time, temperature, ultraviolet exposure, or some combination of these or other variables.

To insure proper coverage of the area under the IC, enough underfill is supplied so that it runs out along the perimeter of the silicon. In the construction of the rigid substrate CSPs, the carrier is slightly (typically approaching 20%) larger in size in the plane of the IC than the IC chip itself. A reason for this is that the underfill material needs a "ledge" to sit on during application (as it flows into the gap). A second reason is that the underfill material does not cure perpendicular to the parallel planes of the IC and the carrier at the perimeter of the IC; instead, it forms a fillet at the perimeter, which is asymmetric about the gap. A properly formed fillet is believed to be important to the reliability enhancement added by the underencapsulant. With the orientation of the package during construction having the IC on the topside, the fillet is typically directly attached to the underside of the IC at its edge and then extending downward, attaching itself onto the rigid carrier, but extending a small distance outward from the area on the carrier defined by the IC chip. A cross-section would reveal that the fillet creates a smooth curve from top to bottom, being slightly concave inward. Thus, for this type of chip scale package, the area ratio between the silicon chip and the carrier is less than 1:1, caused by the additional carrier or substrate area required.

Only one of the technologies described in the literature and known to applicants have a construction in which the package and IC chip are the same size. This technology offered by Tessera, of San Jose, Calif., provides a nearly 1:1 package by mounting the chip on a flexible polyimide tape. Although this size package is advantageous, it is very expensive to make due to the specialized tape required and the complexity of construction using a flexible carrier. Applicants are unaware of any other attempts to provide a 1:1 silicon/package CSP in a type different than that offered by Tessera.

Accordingly, a need remains for a simpler, smaller and less expensive chip scale package design and method of making.

SUMMARY OF THE INVENTION

The invention is chip-scale packaged integrated circuit and fabrication method in which a semiconductor die is mounted on a rigid carrier. This die-carrier assembly forms a unitary package which, in turn, can be mounted on a printed circuit board or substrate. The die and carrier are sized and shaped to substantially identical geometric shapes and positioned such that their respective edge faces are aligned to common planes to form a packaged IC in which the die and carrier have an effective 1:1 area ratio. The die and carrier have contact bumps and contact pads which are interconnected on their facing surfaces and mutually formed to space the facing die and carrier faces a substantially uniform distance apart to define a narrow gap therebetween bridged by the contact interconnections. An underfill material fills the gap between the die and substrate around the interconnections and is bonded to the major faces of the die and carrier to distribute and relieve stresses exerted on the interconnections due to a mismatch of thermal expansion between the die and carrier.

Applicants propose that the asymmetric fillet used in the prior art is not required under certain conditions. Necessary reliability of the solder joints in the rigid carrier type of CSPs can be obtained by having the cured underfill end at the edge faces of the IC chip and rigid carrier. Alternatively, a fillet can be used on one or more sides of the package which is generally T-shaped in cross-section and nearly flat to the aligned side faces of the die and carrier. In this manner, the package could be constructed so that the areas of the carrier and the IC chip match, thus achieving a 1:1 matched area package which is as reliable as prior art chip scale packages.

A fixture can be used to facilitate fabrication, which has a body with a cavity having a depth at least as great as a thickness of the die. The cavity has sidewall arranged and sized to within a predetermined tolerance fit of the size and shape of the die. A seal extends around the cavity sidewalls to seal the edge face of the die and exclude flow of underfill into the bottom of the cavity around the edge faces of the die. The sidewall of the cavity can include a portion above the seal which is beveled to form a trough along the gap to receive and hold the underfill material adjacent the gap. The seal and sidewalls of the cavity preferably have a surface to which the underfill material is nonadherent.

The foregoing and other objects, features and advantages of the invention will become more readily apparent from the following detailed description of a preferred embodiment of the invention which proceeds with reference to the accompanying drawings.

DETAILED DESCRIPTION

Figure 1:
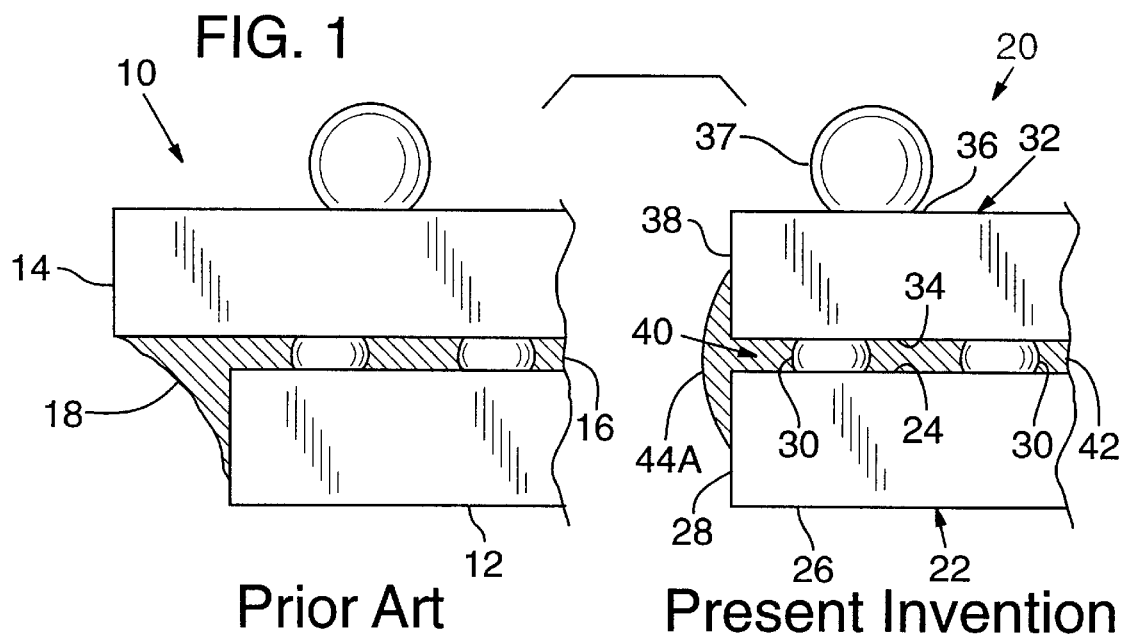
FIG. 1 is a schematic comparing cross-sectional views of a portion of a prior art 120% chip scale package on the left with a 1:1 chip scale package according to the invention on the right.

Referring to the left side of FIG. 1, the prior art chip scale package 10 has a rectangular silicon die 12 connected by contact bumps to contacts on a facing major surface of a ceramic carrier 14. A layer of underfill 16 fills the gap between the faces of the die and carrier. The ceramic carrier 14 has a size approximately 20% larger than that of the die, providing a margin or shelf overlapping the edge of the silicon die. This shelf is used during fabrication to receive and support the underfill material in liquid form along the gap, and to form an asymmetric fillet 18.

The right side of FIG. 1 shows a chip-scale packaged integrated circuit 20 according to the present invention. A semiconductor die 22 is provided which has first and second opposite major die faces 24, 26 and a plurality of die edge faces 28 bounding the major die faces. An integrated circuit is formed on the first die face, with a plurality of conductive contact bumps 30. The semiconductor die 22 is typically formed predominantly of silicon, although other forms of semiconductor can be packaged according to this invention, such GaAs integrated circuits.

A rigid carrier 32 is formed with first and second opposite major carrier faces 34, 36 and a plurality of carrier edge faces 38 bounding the major carrier faces. A plurality of I/O contact pads are formed on the first major carrier surface 34 in position to register with the contact bumps 30 on the first major die face 24. Second level contact bumps 37 are formed on the second major face 36 for connecting the package to a printed circuit board (PCB).

The first major face 34 of the carrier 32 faces the first major face 24 of the die 22 and the contact pads and bumps are fused together to form electrical and mechanical connections therebetween. The contact pads are not visible in this view because they are obscured by the contact bumps 30. The contact bumps and contact pads are mutually sized and shaped to space the first die face 24 and carrier face 34 a substantially uniform distance apart define a narrow gap 40, typically 2 mils to 4 mils wide, bridged by the interconnected contact pads and bumps 30.

The die 22 and carrier 32 are sized and shaped to substantially identical geometric shapes. Such shapes, typically square or rectangular, (with four rectilinear edge faces), can be packaged in accordance with this invention. The die 22 and carrier 32 are positioned such that their respective edge faces 28, 38 are aligned to a common plane within reasonable tolerances (e.g., less than 1 mil). Together, the die and carrier form a packaged IC in which the die and carrier have a substantially 1:1 area ratio.

An underfill material 42 fills the gap 40 between the first major faces of the die and carrier around the connections 30. The underfill material or underencapsulant is selected to bond to the faces 24, 34 of the die and carrier sufficiently to distribute and relieve stresses exerted on interconnections 30 due to any mismatch of thermal expansion between the die and carrier. Typical types of underencapsulant that can be used include off-the-shelf formulations such as Hysol FP4511 and Hysol FP4520, Alpha Metals EL-18, or Thermoset ME510 and Thermoset ME520. The underfill material 42 fills the gap out to at least the edge faces of the die and carrier.

Figure 5:
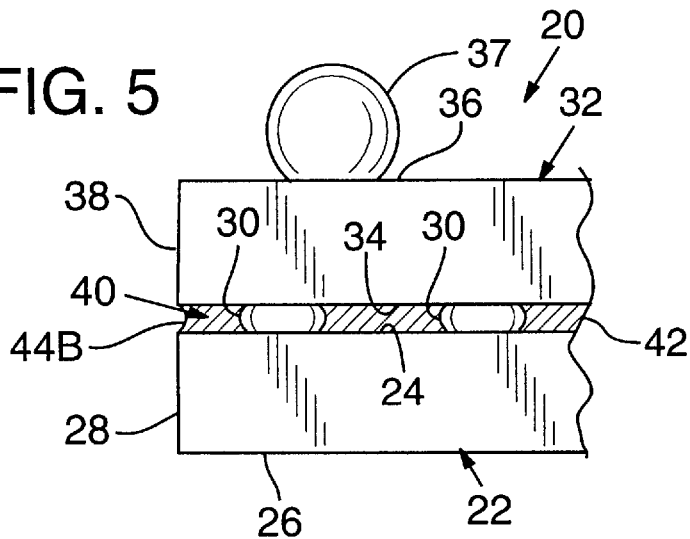
FIG. 5 is another cross-sectional views of a 1:1 chip scale package similar to that shown on the right side of FIG. 1 but with a flush underfill.

As shown in FIG. 1, the underfill material 42 preferably fills the gap and protrudes over the edge faces 28, 38 of both the die and carrier on at least one side of the package. The underfill protruding from the gap overlaps the edge faces substantially uniformly along a linear extent thereof. It is also preferably formed to overlap the edge faces 28, 38 equidistantly in direction transverse to the gap 40 to form a fillet 44A having a T-shaped cross-section. Fillet 44A is thin relative to the prior art; about 1 to 2 mils vs. 4 to 8 mils for fillet 18. It is not essential to have a protruding fillet 44A on all sides of the package. It can be formed along two adjoining sides of the package formed by die 22 and carrier 32. Two or more adjacent sides can be formed with no fillet at all, that is, with the underfill in the gap 40 essentially flush with edge faces 28,38, or having a slightly indented face 44B along the gap, as shown in FIG. 5.

In production, this new type of chip scale package 20 can be constructed in the following way. First, the IC die 22 and the carrier 32 are designed appropriately for the product purpose they are to serve. Next, they are fabricated and interconnected through their contact pads and bumps 30 by methods well known in the industry, and with unfilled gap 40 as described above, to form a CSP assembly ready for underencapsulation.

Figure 2:
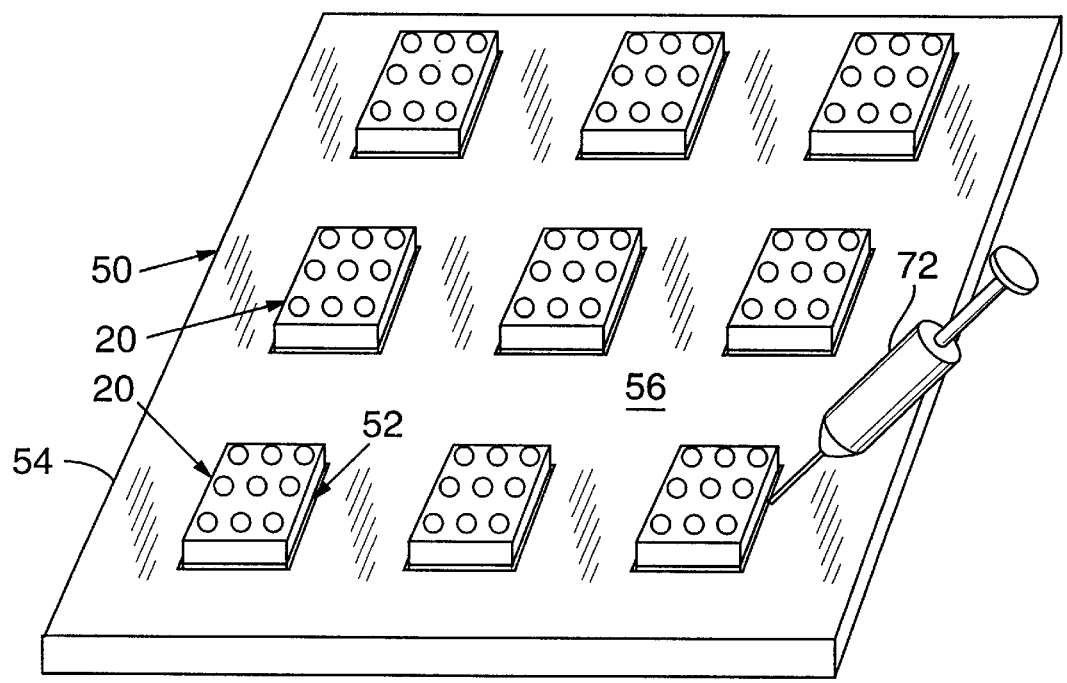
FIG. 2 is a perspective view of a fixture for assembling chip scale packages according to the invention.

Thirdly, referring to FIG. 2, each CSP assembly is placed in a heated (to enable better flow characteristics of the underfill material) fixture or tray 50, upside down—silicon at bottom—in an individual cavity 52, one of several cavities in the tray.

Figure 3:
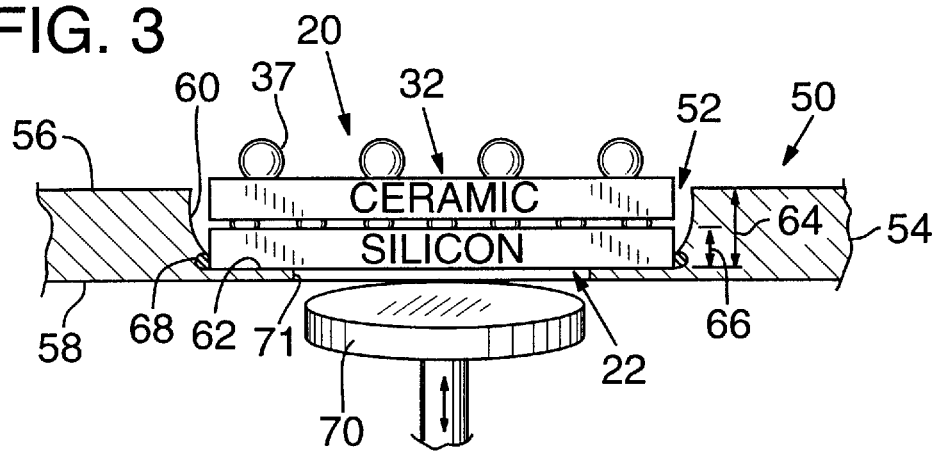
FIG. 3 is a cross-sectional view of a portion of the fixture of FIG. 3.
Figure 4:
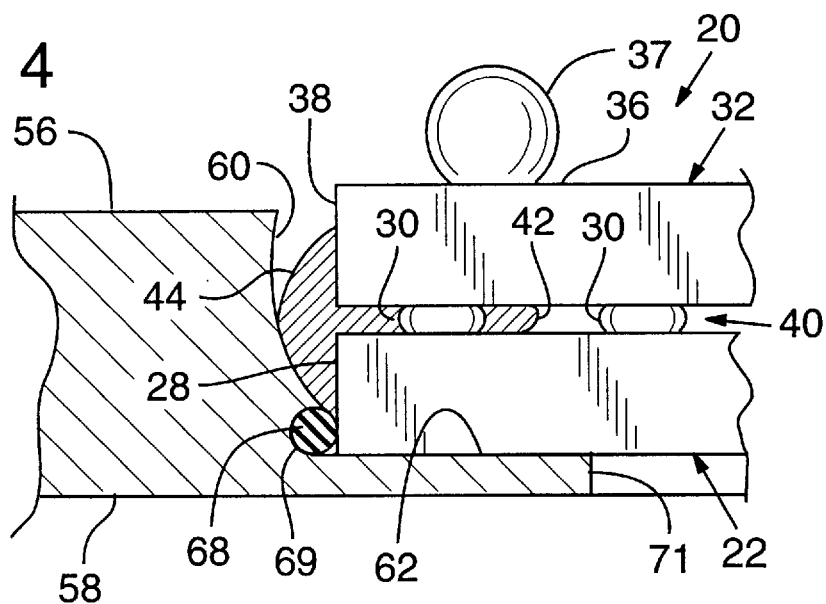
FIG. 4 is an enlarged cross-sectional view of a portion of the fixture of FIG. 3.

Referring to FIG. 3, the tray or fixture 50 comprises a body 54 having a planar upper face 56 and a lower face 58. Each cavity 52 has an opening at the upper face and is and enclosed by four sidewalls 60 extending depthwise to a cavity bottom wall 62 a distance 64 at least as great as a thickness 66 of the die. The height of the sidewalls 60 need not be higher than the height of the CSP assembly—this includes the IC die thickness, the height of the balls 30 used in the attachment between the IC die and the carrier, the thickness of the carrier, and the height of the solder balls on the backside of the carrier. The cavity sidewalls are arranged, typically in a rectangular pattern for rectangular IC chips, and sized to within a predetermined tolerance fit of the size and shape of the particular die 22. The inner dimensions of the cavity allow each newly constructed CSP to just fit, being only slightly larger in the X and Y dimension (e.g., 0.005"–0.010" spacing) than the IC/carrier X and Y dimension. The sidewalls 60 of the cavity each include a portion above the seal which is beveled or slightly concave to form a trough along the gap for receiving and retaining the underfill material along the edge faces of the die and carrier. The walls of each cavity at floor level are machined in such a way as to accommodate a circular or oval cross-section O-ring type seal 68 extends around the cavity sidewalls 60 in a semicircular groove 69 at or near the bottom wall 62 to seal the edge faces 28 of the die. The purpose of the O-ring and beveled or slightly concave sidewalls is to provide a seal against the silicon IC so that the underfill, when applied, does not run down to the cavity floor, but instead will set up with an outward bowed fillet 44A. This type of smooth shape is conducive to reliability of the package. The sidewalls of the cavity have a surface layer of a non-wetting material to which the underencapsulant is nonadherent, such as Teflon® coating material. The seal can be made of, or coated with, Teflon® material. The cavity bottom wall 62 includes a bottom opening 71 through which an ejector 70 can be extended to contact the backside 26 of the die 22 and push the package 20 upward from the fixture cavity and retracted to receive another package for encapsulation.

The underfill is next introduced in a fluid form into the gap 40 between the package and the cavity walls by an underencapsulant injection device, for example, a syringe 72 (FIG. 2). The underfill can be introduced into the trough along one or more sidewalls 60 (typically one, or two adjacent) to fill up the gap 40 (between the silicon and the package carrier both horizontally and vertically by capillary action. Enough underfill is used so that it essentially fills the entire volume of the gap between the carrier and the die.

The underfill material has various characteristics and the underfilling process involves a number variables that affect the resulting underfill. They include viscosity, adhesion properties, resin-to-filler ratio, the size of the filler particles, uniformity of mix, curing temperature and time, room temperature and flow temperature characteristics, rate of underfill introduction, and package orientation during underfilling. Those working in the art are accustomed to varying these characteristics and parameters experimentally to determine those needed to obtain a desired adhesion and thermal mismatch load distribution as well as processing time. By monitoring the flow characteristics and the resulting fillet shapes at the edge faces of the packages, the artisan can also determine the proper underfill formulation and conditions to obtain the desired fillet or underfill edge shape as well as reliability. In general, to obtain the protruding fillet 44A, a more fluid (less viscous) underfill formulation is used and to produce the more flush underfill 44B, a somewhat less fluid (more viscous) formulation will be used. For a given formulation, viscosity can be varied by varying temperature (up to curing temperature) during underfill introduction.

The fixture is heated both to assist the flow of underfill and to accelerate its curing. Once the underfill is almost cured (dimensional stability almost obtained—determined by the type of underfill used) and the injection device removed, the package can be removed from the cavity. The pushing device or ejector 70 is inserted through the opening 71 in the bottom of the cavity in order to push the package out of the cavity. With dimensional stability almost achieved, the underfill can finalize its curing process in air without a flow constraint. A silicon-to-carrier area matched package (with underencapsulant for reliability) is now achieved.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A chip-scale packaged integrated circuit comprising:
   a semiconductor die having first and second opposite major die faces and a plurality of die edge faces bounding the major die faces;
   an integrated circuit formed on the first die face and having a plurality of conductive contact bumps on the first major die face;
   a rigid carrier having first and second opposite major carrier faces and a plurality of carrier edge faces bounding the major carrier faces, the first major carrier face facing the first major die face;
   a plurality of I/O contact pads formed on the first major carrier surface in registration with the contact bumps on the first major die face and fused together to form electrical and mechanical connections therebetween;
   the contact bumps and contact pads being mutually formed to space the first die face and first carrier face a substantially uniform distance apart define a narrow gap therebetween bridged by said connections; and
   an underfill material filling the gap between the first major faces of the die and carrier around the connections and bonded to said faces to distribute and relieve stresses exerted on the interconnections due to a mismatch of thermal expansion between the die and carrier;
   the die and carrier being sized and shaped to substantially identical geometric shapes and positioned such that their respective edge faces are aligned to a common plane to form a packaged IC in which the die and carrier have a substantially 1:1 area ratio.

2. A chip-scale packaged integrated circuit according to claim 1 in which the underfill material fills the gap out to at least the edge faces of the die and carrier.

3. A chip-scale packaged integrated circuit according to claim 1 in which the underfill fills the gap and protrudes over the edge faces of both the die and carrier on at least one side thereof.

4. A chip-scale packaged integrated circuit according to claim 3 in which the underfill protruding from the gap overlaps the edge faces substantially uniformly along a linear extent thereof.

5. A chip-scale packaged integrated circuit according to claim 3 in which the underfill protruding from the gap overlaps the edge faces equidistantly in direction transverse to the gap to form a fillet having a T-shaped cross-section.

6. A chip-scale packaged integrated circuit according to claim 1 in which the underfill fills the gap and protrudes over the edge faces of both the die and carrier on at least two adjoining sides thereof.

7. A chip-scale packaged integrated circuit according to claim 1 in which the die and carrier each have four rectilinear edge faces.

8. A chip-scale packaged integrated circuit according to claim 7 in which the underfill fills the gap and protrudes over the edge faces of both the die and carrier on at least two adjoining sides thereof.

9. A chip-scale packaged integrated circuit according to claim 1 in which the underfill fills the gap out to the edge face of both the die and carrier on at least one side of the package.

10. A chip-scale packaged integrated circuit according to claim 1 in which the underfill fills the gap out to and substantially flush with the edge face of both the die and carrier on at least two adjoining sides of the package.

* * * * *